United States Patent [19]

Hong

[11] Patent Number: 5,395,779

[45] Date of Patent: Mar. 7, 1995

[54] PROCESS OF MANUFACTURE OF SPLIT GATE EPROM DEVICE

[75] Inventor: Gary Hong, Hsin-Chu, Taiwan, Prov. of China

[73] Assignee: United Microelectronics Corporation, Hsinchu, Taiwan, Prov. of China

[21] Appl. No.: 224,695

[22] Filed: Apr. 8, 1994

[51] Int. Cl.$^6$ .......................................... H01L 21/265
[52] U.S. Cl. ........................................ 437/43; 437/49; 437/228
[58] Field of Search ...................... 437/41, 43, 45, 49, 437/228; 257/315, 316

[56] References Cited

U.S. PATENT DOCUMENTS

| | | | |
|---|---|---|---|
| 4,988,635 | 1/1991 | Ajika et al. | 437/43 |
| 5,045,488 | 9/1991 | Yeh | 437/43 |
| 5,242,848 | 9/1993 | Yeh | 437/43 |

OTHER PUBLICATIONS

"A 128K Flash EEPROM Using Double-Polysilicon Technology" IEEE J. Solid-State Circuits, vol. SC-22, No. 5, pp. 676-683 (Oct. 1987).

Primary Examiner—Olik Chaudhuri
Assistant Examiner—Richard A. Booth
Attorney, Agent, or Firm—George O. Saile; Graham S. Jones, II

[57] ABSTRACT

Fabrication of a MOSFET comprises, forming a dielectric layer on a substrate and a sacrificial structure on portions of the dielectric layer, forming a first polysilicon layer over the sacrificial structure and other exposed surfaces of the device, patterning the first polysilicon layer and the dielectric layer by masking and etching to form a stepped electrode structure partially upon the sacrificial structure and partially upon the other exposed surfaces of the device, applying ion implantation into the substrate outside of the area covered by the stepped electrode structure, removing the sacrificial layer from the surface of the substrate and from beneath the stepped electrode structure leaving an overhanging surface of the stepped electrode structure, forming a second layer of dielectric material on the exposed surfaces of the stepped electrode structure and the substrate, and forming a second polysilicon layer over and under overhanging portions the second layer of dielectric material and the substrate.

15 Claims, 4 Drawing Sheets

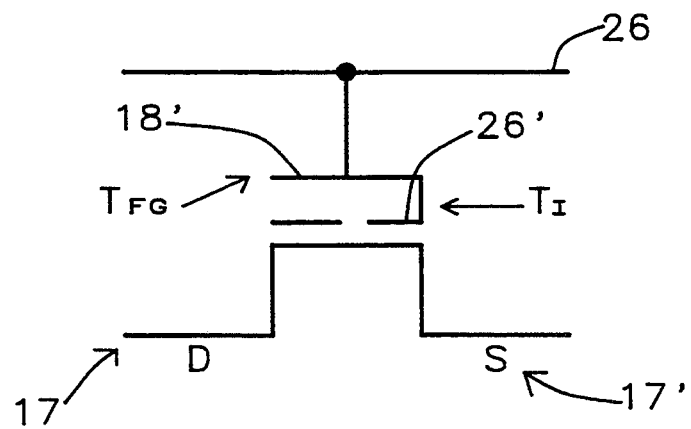
FIG. 7
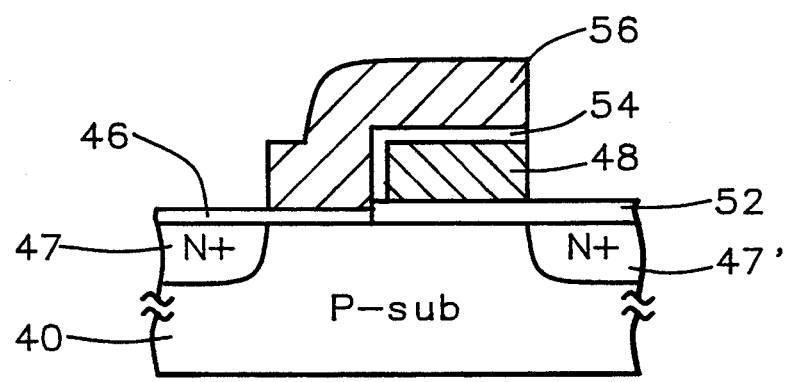
FIG. 8 – Prior Art

PROCESS OF MANUFACTURE OF SPLIT GATE EPROM DEVICE

BACKGROUND OF THE INVENTION

1. Field of the Invention

This invention relates to semiconductor memories and more particularly to devices with high capacitive coupling ratios.

2. Description of Related Art

Referring to FIG. 8, a conventional prior art split gate device is shown which includes a P- substrate 40 with N+ S/D regions 47, 47' on either side of a polysilicon 1 floating gate 48 and a polysilicon 2 control gate 56. The edge of the floating gate 48 is adjacent to one region 47' of the S/D regions but spaced away from the other region 47. The control gate 56 however, which overlies the floating gate 48 reaches the edge of the other region 47 of the S/D regions and its edge which is distal from the floating gate 48. Gate oxide is located between the control gate 56 and substrate 40. A thicker oxide layer 52 is formed between floating gate 48 and substrate 40. Samachisa et al "A 128 k Flash EEPROM Using Double-Polysilicon Technology" IEEE J. Solid-State Circuits, Vol. SC-22, No. 5, pp 676–683, (Oct. 1987) shows a conventional prior art split gate structure of the kind illustrated by FIG. 8.

United States patent No. 5,045,488 of Yeh for "Method of Manufacturing a Single Transistor Non-Volatile, Electrically Alterable Semiconductor Memory Device" and U.S. Pat. No. 4,988,635 of Ajika et al for "Method of Manufacturing Non-Volatile Semiconductor Memory Device" show processes for manufacturing EPROM devices.

SUMMARY OF THE INVENTION

An object of this invention is to provide a split gate memory with a substantially greater capacitive coupling ratio. A high coupling ratio is desirable to as follows:
1) provide lower (high) program and erase voltages;
2) provide higher read current.

In accordance with this invention a method of fabricating an MOSFET device on a semiconductor substrate comprises, forming a dielectric layer on the substrate, forming a sacrificial structure on portions of the dielectric layer, forming a first polysilicon layer over the sacrificial structure and other exposed surfaces of the device, patterning the first polysilicon layer and the dielectric layer by masking and etching to form a stepped electrode structure partially upon the sacrificial structure and partially upon the other exposed surfaces of the device, applying ion implantation into the substrate outside of the area covered by the stepped electrode structure, removing the sacrificial layer from the surface of the substrate and from beneath the stepped electrode structure leaving an overhanging surface of the stepped electrode structure, forming a second layer of dielectric material on the exposed surfaces of the stepped electrode structure and the substrate, and forming a second polysilicon layer over and under overhanging portions the second layer of dielectric material and the substrate.

Further in accordance with this invention, a method is provided for fabricating an MOSFET device on a semiconductor substrate, which method comprises forming a silicon dioxide gate oxide dielectric layer on the substrate, forming a silicon nitride sacrificial structure on portions of the dielectric layer, etching away exposed portions of the gate oxide dielectric layer to expose portions of the surface of the substrate and forming a tunnel oxide layer over exposed surfaces of the substrate, forming a first polysilicon layer over the sacrificial structure and the tunnel oxide layer, patterning the first polysilicon layer and the dielectric layer by masking and etching to form a stepped electrode structure partially upon the sacrificial structure and partially upon the tunnel oxide layer, ion implanting arsenic ions into the substrate outside of the area covered by the stepped electrode structure forming buried bit lines in the substrate, removing the sacrificial layer from the surface of the substrate and from beneath the stepped electrode structure leaving an overhanging surface of the stepped electrode structure, forming a second layer of dielectric material on the exposed surfaces of the stepped electrode structure and the substrate, and forming a second polysilicon layer over and under overhanging portions the second layer of dielectric material and the substrate.

Preferably, before forming the second layer of dielectric material on the exposed surfaces of the stepped electrode structure and the substrate buried bit lines are implanted into the substrate;

the buried bit lines are implanted into the substrate with arsenic (As) N+ dopant with an energy of about 50 keV, and a dose of As of about $3 \times 10^{15}/cm^2$;

after implanting the buried bit lines into the substrate a step of forming a self aligned thick oxide structure is performed by oxidation of the exposed surface of the substrate;

the self-aligned thick oxide structure is formed by oxidation in oxygen gas ($O_2$) at a preferred temperature of about 900° C. for a time of about 10 minutes; and the oxidation continues until a thickness of about 500 Å is obtained; and the self-aligned thick oxide structure is formed over the buried bit lines; and the second layer of dielectric material comprises ONO.

BRIEF DESCRIPTION OF THE DRAWINGS

The foregoing and other aspects and advantages of this invention are explained and described below with reference to the accompanying drawings, in which:

FIG. 7 shows an electrical schematic diagram of a circuit formed on the device of FIG. 6 in which a polysilicon 2 layer forms a control gate and a word line WL and the gate of an isolation transistor $T_I$.

FIG. 8 shows a conventional prior art split gate device is shown which includes a P- substrate with N+ S/D regions on either side of a polysilicon 1 floating gate and a polysilicon 2 control gate.

DESCRIPTION OF THE PREFERRED EMBODIMENT

This invention provides a structure and a process sequence for producing a high-density split-gate flash memory, which features very high capacitive coupling ratio.

Figure 1:
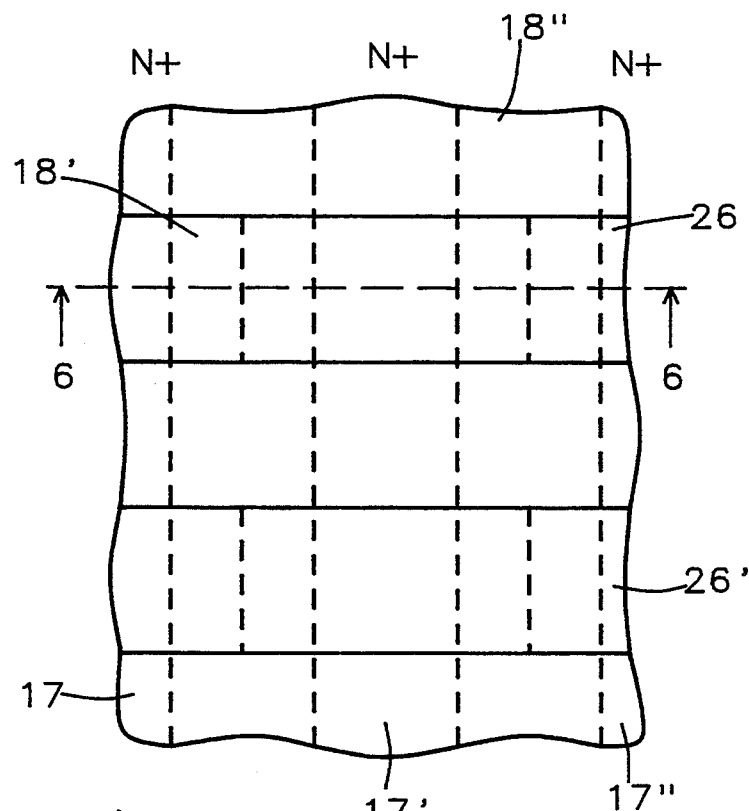
FIG. 1 shows a plan view of a fragment of an EPROM device in accordance with this invention.

FIG. 1 shows a plan view of a fragment of an EPROM device in accordance with this invention.

PROCESS

Front End Process

Figure 2:
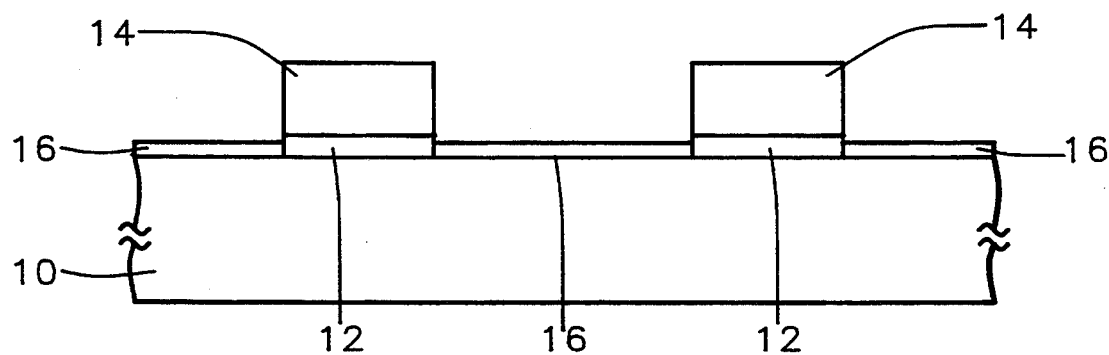
FIG. 2 shows a device in the early stages of fabrication in accordance with the method of this invention.

FIG. 2 shows a device in the early stages of fabrication in accordance with the method of this invention including a substrate 10 of silicon doped as a P-sub. An EPROM produced including the product of the following process comprises an embodiment of this invention.

Gate Oxidation

By the conventional process of gate oxidation the substrate 10 is covered with a blanket of gate oxide layer to a thickness of about 200 Å in accordance with a process well known by those skilled in the art.

Silicon Nitride

A blanket deposition of a thin film silicon nitride sacrificial layer 14 is deposited to a thickness of about 2000 Å.

Silicon nitride ($Si_3N_4$) layer 14 is patterned by a standard photolithographic process followed by etching, thereby forming sacrificial silicon nitride structures 14 as shown in FIG. 2.

The sacrificial silicon nitride structures 14 are used for etching patterns in the gate oxide layer 12, removing all of the exposed surface of gate oxide layer 12. The method of etching the gate oxide layer 12 comprises a wet etch, 10:1 BHF (buffered hydrogen fluoride.)

Tunnel Oxide

After the gate oxide layer 12 has been removed, tunnel oxide layer 16 is grown in place of the gate oxide to a thickness of about 100 Å. A range of thickness from about 60 Å to about 150 Å is possible. Outside of that range of thicknesses the result is inadequate because it is impractical since high voltage will be needed for program/erase operations. The process of growing the tunnel oxide is thermal oxidation in dry $O_2N_2$ (e.g. 850° C. for 20 minutes.)

Figure 3:
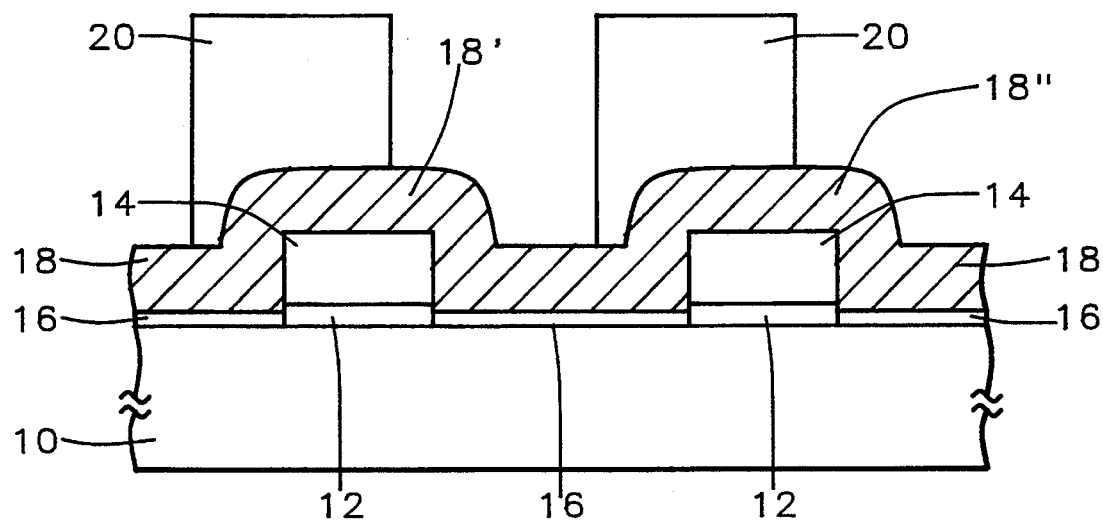
FIG. 3 shows the product of FIG. 2 after a blanket deposition of a polysilicon 1 layer followed by blanket deposition of photoresist formed into photoresist mask structures for etching the polysilicon 1 layer and making buried bit lines later.

Referring to FIG. 3, the product of FIG. 2 is shown after a blanket deposition polysilicon 1 layer 18 followed by blanket deposition of photoresist and formation of photoresist mask structures 20 for making buried bit lines later.

Polysilicon 1

The polysilicon 1 layer 18 was deposited to a thickness of about 2000 Å by the conventional LPCVD (low pressure chemical vapor deposition) process. A range of thickness from about 1000 Å to about 4000 Å is possible.

Polysilicon 1 layer 18 is doped with a blanket doping of phosphoryl chloride ($POCl_3$) at 900° C. for 20 minutes or by ion implantation. The arsenic (As) dopant is applied with a dose within a range from about $1 \times 10E14$ $cm^{-2}$ to about $1 \times 10E16$ $cm^{-2}$ within a range of energies from about 20 keV to about 80 keV.

Bit Line Masking

Figure 5:
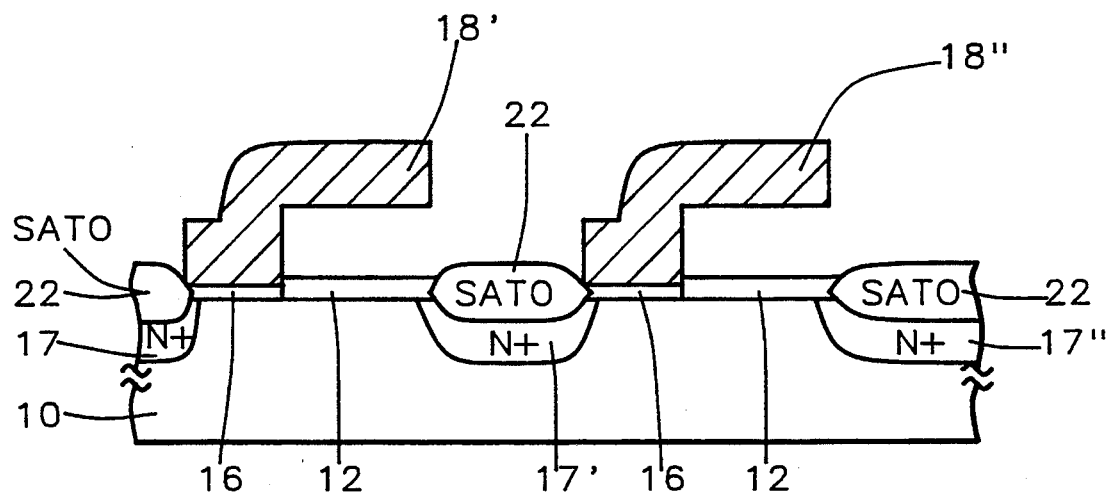
FIG. 5 shows the product of FIG. 4 is after Self Aligned Thick Oxide (SATO) regions were formed by oxidation of the surface of substrate forming silicon dioxide and the silicon nitride sacrificial structures are stripped by wet etching.
Figure 6:
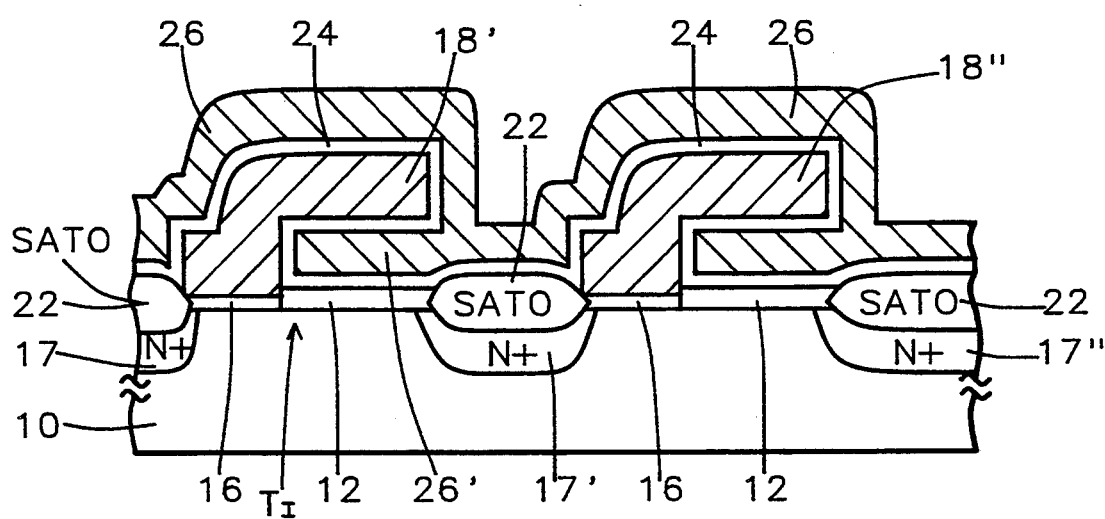
FIG. 6 shows the product of FIG. 5 after formation of interpolysilicon sandwich of a dielectric layer such as ONO followed by deposition of a polysilicon 2 layer.

Then photoresist mask structures 20 (for etching polysilicon 1 layer 18 and making buried bit lines 17, 17' and 17" seen in FIGS. 5 and 6) are formed on the polysilicon 1 layer 18.

Polysilicon 1 Etching with Bit Line Mask

Figure 4:
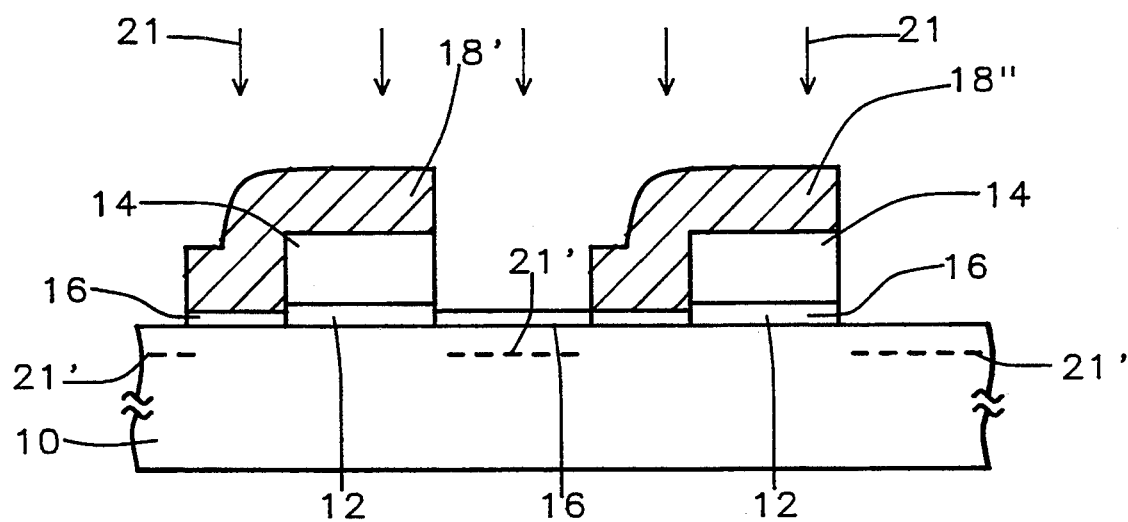
FIG. 4 shows the product of FIG. 3 after the mask structures have been used to etch the polysilicon 1 blanket layer, forming "stepped" polysilicon 1 structures and over and to the left of the silicon nitride structures

FIG. 4 shows the product of FIG. 3 after the mask structures 20 have been used to etch the polysilicon 1 blanket layer 18, forming "stepped" polysilicon 1 structures 18' and 18" over and to the left of the silicon nitride structures 14. Polysilicon 1 structures 18 and 18' are stepped in that they rise over sacrificial nitride structures 14 and they provide a pair of steps up from the substrate 10. The mask structures 20 have been removed from the device of FIG. 3 as shown in FIG. 4.

Bit Line Ion Implantation

To prepare to form buried bit lines in the substrate 10, arsenic (As) N+ dopant 21 is implanted into all of the exposed surface of the substrate 10 as dopant 21' using the polysilicon 1 structures 18' and 18" as masks. The implantation of those As ions is performed preferably with an energy of about 50 keV. A range of energies from about 30 keV to about 100 keV is possible. The dose of As is preferably $3 \times 10E15/cm^2$. A range of doses from about $1 \times 10E15$ $cm^{-2}$ to about $8 \times 10E16$ $cm^{-2}$ is possible.

Referring to FIG. 5, the product of FIG. 4 is shown after Self Aligned Thick Oxide (SATO) regions were formed by oxidation of the surface of substrate forming silicon dioxide and the silicon nitride sacrificial structures are now stripped by wet etching.

Self Aligned Thick Oxide (SATO)

To form the SATO regions 22, the surfaces of the substrate 10 in FIG. 4 were exposed to oxygen gas ($O_2$) at a preferred temperature of about 900° C., for an optimum time of about 10 minutes) of gate oxide layer 12. The SATO oxidation continues preferably until a thickness of about 500 Å is obtained as shown in FIG. 5. A range of thickness from about 300 Å to about 1500 Å is possible. Thicker SATO will have smaller capacitance between the control gate to the N+ area, which in turn will have a better coupling ratio. However, thicker SATO layers consume N+ dopant and result in higher N+ bit line (B/L) resistance. SATO regions 22 are formed over the buried bit lines 17, 17' and 17". The process employed for forming the SATO regions 22 comprises thermal oxidation in a gas environment of oxygen ($O_2$) or oxygen/nitrogen $O_2/N_2$ under parameters within ranges as follows:

A range of temperatures from about 800° C. to about 950 ° C. is possible. Outside of that range of thicknesses the result is inadequate. For the lower temperatures the times are longer. For higher temperatures the time is reduced. At less than about 800° C. the oxidation rate is too slow to be practical. At above about 950° C. the temperature is too high and will cause too much diffusion of N+ ions. A range of times from about 10 minutes at about 950° C. to about 30 minutes at about 800°

C. are examples of the range of times and temperatures possible.

Stripping of Silicon Nitride

The silicon nitride sacrificial structures 14 are now stripped by phosphoric acid (H3PO4) in a wet etch. There is no problem is removing the silicon nitride from below the overhanging polysilicon 1 layer 18', 18" because of the wet etching process which is isotropic. After structures 14 are removed the structure shown in FIG. 5 remains.

FIG. 6 shows the product of FIG. 5 after formation of interpolysilicon sandwich of dielectric (e.g. ONO) layer 24 followed by deposition of polysilicon 2 layer 26.

Interpolysilicon Dielectric (ONO)

Formation of interpolysilicon sandwich of dielectric (e.g. ONO) with an effective thickness of ONO, preferably of about 200 Å is applied to the exposed surfaces of the device of FIG. 5 by means of a conventional process. A range of thickness from about 150 Å to about 300 Å is possible. Outside of that range of thicknesses the result is inadequate because it is too thin (below about 150 Å) so that charge retention would be bad or too thick (above about 300 Å) because of reduced coupling ratio.

Polysilicon 2

Polysilicon 2 layer 26 which will serve as a word line (W/L) is deposited to a conventional thickness of from about 2000 Å to about 4000 Å.

The polysilicon 2 layer 26 is doped with a blanket doping of phosphoryl chloride (POCl3) at about 900° C. for 20 minutes.

Polysilicon 2 layer 26 is patterned to form word line WL. This forms a stacked gate polysilicon 2/polysilicon 1 in a self-aligned etch.

Back End Process

Conventional back end process steps follow.

Industrial Applicability

The polysilicon 2 word line WL also is located beneath the polysilicon 1 in areas where the silicon nitride structures 14 have been etched away. In this configuration, the polysilicon 1 structures 18', 18" form a floating gate structure. In that connection, referring to FIG. 7, which shows an electrical schematic diagram of a circuit formed on the device of FIG. 6, the polysilicon 2 layer 26 forms a control gate and a word line WL and the gate 26' of an isolation transistor $T_I$. Gate 26' is part of an isolation transistor along with ONO layer 24 gate oxide 12, P-sub 10 and buried N+ regions 17 and 17'. When gate 26/26'(WL) is at 0 volts the isolation transistor $T_I$ can isolate the cell conduction when the cell is over-erased (split gate structure) gate 26'. The polysilicon 1 structure 18' is surrounded by polysilicon 2 control gate structures 26/26'. As a result, the surface areas confronting each other between polysilicon 1 floating gate 18' and and polysilicon 2 control gate 26/26' structure are increased, and accordingly the coupling ratio is increased because of that increasing area of confrontation.

This structure can have split-gate flash cell characteristics, which are known to be able to overcome the overerase problem.

In addition, this structure can have a very high coupling ratio.

The example of the operation is summarized in the Table I below, where Vg is the voltage on control gate 26.

TABLE I

|  | $V_{DRAIN}$ | $V_{SOURCE}$ | Vg |
| --- | --- | --- | --- |
| PROGRAM | 6.0V | 0V | 12V |
| ERASE | 12.0V | 0V | 0V |
| READ | 1.5V | 0V | 3V |

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of fabricating a EPROM device on a semiconductor substrate comprising:
    forming a dielectric layer on said substrate,
    forming a sacrificial structure on portions of said dielectric layer,
    forming a first polysilicon layer over said sacrificial structure and other surfaces of said device,
    patterning said first polysilicon layer and said dielectric layer by masking and etching to form a stepped electrode structure partially upon said sacrificial structure and partially upon said other surfaces of said device,
    ion implanting into said substrate outside of an area covered by said stepped electrode structure,
    removing said sacrificial layer from the surface of said substrate and from beneath said stepped electrode structure leaving an overhanging surface of said stepped electrode structure,
    forming a second layer of dielectric material on exposed surfaces of said stepped electrode structure and said substrate, and
    forming a second polysilicon layer over and under overhanging portions of said stepped electrode structure and over said second layer of dielectric material and said substrate.

2. A method in accordance with claim 1 wherein said ion implanting into said substrate forms buried bit lines.

3. A method in accordance with claim 2 wherein said buried bit lines are implanted into said substrate with N+ dopant with an energy of between about 30 to 100 kev, and a dose of between about 1 E 15 to 6 E 16/cm².

4. A method in accordance with claim 1 wherein after implanting said buried bit lines into said substrate a step of forming a self aligned oxide structure is performed by oxidation of the exposed surface of said substrate.

5. A method in accordance with claim 4 wherein said self aligned oxide structure is formed by oxidation in oxygen gas (O2) at a temperature of about 900 ° C.

6. A method in accordance with claim 5 wherein said oxidation continues until a thickness of about 300 to 1500 Å is obtained.

7. A method in accordance with claim 5 wherein said self aligned thick oxide structure is formed over said buried bit lines.

8. A method in accordance with claim 5 wherein said second layer of dielectric material comprises ONO.

9. A method of fabricating a EPROM device on a semiconductor substrate comprising:

forming a silicon dioxide gate dielectric layer on said substrate, forming a silicon nitride sacrificial structure on portions of said dielectric layer, etching away exposed portions of said gate dielectric layer to expose portions of the surface of said substrate and forming a tunnel oxide layer over exposed surfaces of said substrate, forming a first polysilicon layer over said sacrificial structure and said tunnel oxide layer, patterning said first polysilicon layer and said dielectric layer by masking and etching to form a stepped electrode structure partially upon said sacrificial structure and partially upon said tunnel oxide layer, ion implanting ions into said substrate outside of the area covered by said stepped electrode structure forming buried bit lines in said substrate, removing said sacrificial layer from the surface of said substrate and from beneath said stepped electrode structure leaving an overhanging surface of said stepped electrode structure, forming a second layer of dielectric material on exposed surfaces of said stepped electrode structure and said substrate, and forming a second polysilicon layer over and under overhanging portions of said stepped electrode structure and over said second layer of dielectric material and said substrate.

10. A method in accordance with claim 9 wherein said buried bit lines are implanted into said substrate with N+ dopant with an energy of between about 30 to 100 kev, and a dose of between about 1 E 15 to 6 E 16/cm$^2$.

11. A method in accordance with claim 9 wherein after implanting said buried bit lines into said substrate a step of forming a self aligned oxide structure is performed by oxidation of the exposed surface of said substrate.

12. A method in accordance with claim 11 wherein said self aligned oxide structure is formed by oxidation in oxygen gas ($O_2$) at a temperature of about 900° C.

13. A method in accordance with claim 12 wherein said oxidation continues until a thickness of about 300 to 1500 Å is obtained.

14. A method in accordance with claim 12 wherein said self aligned oxide structure is formed over said buried bit lines.

15. A method in accordance with claim 12 wherein said second layer of dielectric material comprises ONO.

* * * * *